United States Patent
Pan et al.

(10) Patent No.: US 6,917,061 B2
(45) Date of Patent: Jul. 12, 2005

(54) ALGAAS OR INGAP LOW TURN-ON VOLTAGE GAAS-BASED HETEROJUNCTION BIPOLAR TRANSISTOR

(75) Inventors: Noren Pan, Wilmette, IL (US); Byung-Kwon Han, Evanston, IL (US)

(73) Assignee: Microlink Devices, Inc., Niles, IL (US)

( * ) Notice: Subject to any disclaimer, the term of this patent is extended or adjusted under 35 U.S.C. 154(b) by 331 days.

(21) Appl. No.: 10/201,760

(22) Filed: Jul. 22, 2002

(65) Prior Publication Data

US 2003/0032252 A1 Feb. 13, 2003

Related U.S. Application Data

(60) Provisional application No. 60/306,846, filed on Jul. 20, 2001.

(51) Int. Cl.[7] .......................................... H01L 21/8228
(52) U.S. Cl. ....................... 257/197; 438/172; 438/312; 438/313; 438/317; 438/309; 438/322; 257/12; 257/14; 257/15; 257/47; 257/183; 257/183.1; 257/198
(58) Field of Search ................................. 438/322, 309, 438/312–313, 317, 172, 191, 235; 257/11–12, 14–15, 47, 183

(56) References Cited

U.S. PATENT DOCUMENTS

| | | | | | |
|---|---|---|---|---|---|
| 4,792,832 A | * | 12/1988 | Baba et al. | .................... | 257/22 |
| 4,821,082 A | * | 4/1989 | Frank et al. | ................. | 257/198 |
| 4,839,303 A | * | 6/1989 | Tully et al. | ................. | 438/312 |
| 5,041,882 A | * | 8/1991 | Katoh | .......................... | 257/198 |
| 5,177,583 A | * | 1/1993 | Endo et al. | .................. | 257/190 |
| 5,239,550 A | * | 8/1993 | Jain | .............................. | 372/45 |
| 5,329,145 A | * | 7/1994 | Nakagawa | .................... | 257/198 |
| 5,508,536 A | * | 4/1996 | Twynam et al. | ............. | 257/197 |
| 5,648,666 A | * | 7/1997 | Tran et al. | .................... | 257/197 |
| 5,734,193 A | * | 3/1998 | Bayraktaroglu et al. | .... | 257/579 |
| 5,821,825 A | * | 10/1998 | Kobayashi | .................... | 331/66 |
| 6,436,784 B1 | * | 8/2002 | Allam | .......................... | 438/380 |
| 6,462,362 B1 | * | 10/2002 | Miyoshi | ...................... | 257/198 |
| 6,465,289 B1 | * | 10/2002 | Streit et al. | .................. | 438/167 |
| 6,545,340 B1 | * | 4/2003 | Higgs et al. | ................. | 257/565 |
| 6,611,008 B2 | * | 8/2003 | Twynam et al. | ............. | 257/197 |
| 6,661,037 B2 | * | 12/2003 | Pan et al. | ..................... | 257/197 |
| 6,696,710 B2 | * | 2/2004 | Moll et al. | .................... | 257/190 |
| 6,750,480 B2 | * | 6/2004 | Welser et al. | ................ | 257/183 |
| 6,765,242 B1 | * | 7/2004 | Chang et al. | ................ | 257/197 |
| 2001/0048120 A1 | * | 12/2001 | Shimawaki | .................. | 257/198 |
| 2002/0088993 A1 | | 7/2002 | Twynam et al. | ............. | 257/192 |

OTHER PUBLICATIONS

Gokhale et al. "High–power high–efficiency 0.98–um wavelenght InGaAs–(IN)GaAs(P)–InGaP broadened waveguide lasers grown by gas–source molecular beam epitaxy" IEEE Journ. of quatum electronics vol. 33 No. 12 Dec. 1997 p. 2266–2276.*

(Continued)

Primary Examiner—B. William Baumeister
Assistant Examiner—Granvill D. Lee, Jr.
(74) Attorney, Agent, or Firm—Lahive & Cockfield, LLP; Anthony A. Laurentano, Esq.; David R. Burns, Esq.

(57) ABSTRACT

A heterojunction bipolar transistor is provided that has a reduced turn-on voltage threshold. A base spacer layer is provided and alternately an emitter layer is provided that has a lowered energy gap. The lowered energy gap of the base spacer or the emitter spacer allow the heterojunction bipolar transistor to realize a lower turn-on voltage threshold. The thickness of the emitter layer if utilized is kept to a minimum to reduce the associated space charge recombination current in the heterojunction bipolar transistor.

4 Claims, 6 Drawing Sheets

OTHER PUBLICATIONS

Usami et al. "0.98–um InGaAs–InGaP strained quatum–well lasers with GaAs–InGaP superlattice optical confinement layer" IEEE Journ. of selected topics in quantum electronics vol. 1 No. 2 Jun. 1995 p. 244–249.*

Oka et al. "Low turn–on voltage GaAs heterojunction bipolar transistors with a pseudomorphic GaAsSb base" Applied Phy.Letters, vol. 78 No. 4 p. 483–485 Jan. 22, 2001.*

Yan et al. "InGaP/GaAsSb/GaAs DHBT's with low turn–on voltage and high current gain" Indium Phosphide and related materials conference, 2002. IPRM 14th, May 12–16, 2002 p. 169–172.*

Yan et al. "Low turn–on voltage InGaP/GaAsSb/GaAs double HBT's grown by MOCVD" IEEE electron device letters vol. 23, No. 4 Apr. 2002 p. 170–172..*

Teissier et al. "Temperature–dependent valence band offset and band–gap energies of pseudomorphic GaAsSb on GaAs" Journ. of Applied Phys. vol. 89 No. 10 May 15, 2001 p. 5473–5477.*

J. H. Joe et al. High–gain InGaAs HBT's with compositionally graded InGaAs bases grown by molecular beam epitaxy Electron Devices for Microwave and Optoelectronic Applications, 2002. EDMO 2002. The 10th IEEE International Symposium.*

Cheung et al."Novel InGaP/GaAsSb/GaAs DHBT" Electron Devices and Solid–State Circuits, 2003 IEEE Conference on , Dec. 16–18, 2003 pp.:339–342.*

Ito et al. InGaAs double heterojunction bipolar transistors grown on GaAs substrates Electronics letters vol. 28 No. 7 Mar. 1992 p. 655–656.*

Hill et al. "Uniform, high gain AlGaAs/InGaAs/GaAs p–n–p heterojunction bipolar transistor by dual selective etch process" IEEE electron device letters vol. 11 No. 10 Oct. 1990 p. 425–427.*

Anastasiou et al. "Double heterojunction bipolar transistor in AlGaAs/GaAsSb system" Electronics letters vol. 27 No. 2 Jan. 1991 p. 142–144.*

Lour W.S. "High–gain, lowoffset voltage, and zero potential spike by InGaP/GaAs delta doped single heterojunction bipolar transistor" IEEE Trans. on electron devices vol. 44 No. 2 Feb. 1997 p. 346–348.*

Yang et al. "Comparison of GaInP/GaAs heterostructure–emitter bipolar transistors and heterojunction bipolar transistors" IEEE Trans. on electron devices vol. 42 No. 7 Jul. 1995 p. 1210–1215.*

Oka, T. et al. "Low turn–on voltage GaAs heterojunction bipolar transistors with a pseudomorphic GaAsSb base" *Applied Physics Letters*. Jan. 22, 2001; 78(4):483–485.

Sullivan, G.J. et al. "High Gain AlInAs/GaAsSb/AlInAs NpN HBTs on InP" *Journal of Electronic Materials*. 1992; 21(10):1123–1125.

Yan, B.P. et al. "Low Turn–on Voltage InGaP/GaAsSb/GaAs Double HBTs Grown by MOCVD" *IEEE Electron Device Letters* Apr. 2002, 23(4):170–172.

Yan, B.P. et al. "InGaP/GaAsSb/GaAs DHBTs with Low Turn–on Voltage and High Current Gain" *14th Indium Phosphide and Related Materials Conference (IPRM'02)*, May 12–16, 2002, Stockholm, Sweden, pp. 169–172.

* cited by examiner

ALGAAS OR INGAP LOW TURN-ON VOLTAGE GAAS-BASED HETEROJUNCTION BIPOLAR TRANSISTOR

RELATED APPLICATIONS

This application claims priority to U.S. provisional application Ser. No. 60/306,846, filed on Jul. 20, 2001, and entitled AlGaAs or InGaP Low Turn-On Voltage GaAs-based Heterojunction Bipolar Transistor.

BACKGROUND OF THE INVENTION

This invention relates generally to semiconductor transistors. In particular, the invention relates to heterojunction bipolar transistors. Heterojunction bipolar transistors (HBTs) offer much higher speed of operation than the more prevalent metal-oxide-semiconductor field-effect transistors (MOSFETs) or even conventional homojunction bipolar transistors, e.g., pnp or npn silicon transistors. Because HBTs offer high speed, a high current driving capability, and a low 1/f noise levels, HBTs are becoming popular for use as integrated switching devices and microwave devices in wireless communications systems and sub-systems, satellite broadcast systems, automobile collision avoidance systems, global positioning systems, and other high-frequency applications. One application in which HBT use continues to increase is in the design and manufacture of wireless electronic devices, such as wireless telephones and other like electronic devices that are capable of communicating with a network in a wireless manner.

As with all wireless electronic devices, power added efficiency ($\eta_{PA}$) and reliability of the device is a critical concern to both the designer and the consumer of the portable wireless device. For example, it is desirable to maximize power added efficiency and reliability of the wireless electronic device by providing the device with one or more HBT power amplifiers that minimize current drain of the device's power source, such as a battery. By providing the wireless electronic device with efficient HBT power amplifiers often results in a desirable increase in the amount of operating time per battery charge of the wireless electronic device. As such, the talk time and standby time of a wireless telephone is improved. Moreover, it is desirable to increase the reliability and speed of the HBT power amplifiers provided in the wireless electronic device by lowering the operating voltages of the HBT power amplifiers.

SUMMARY OF THE INVENTION

The present invention addresses the above-described problems associated with electronic devices that rely upon a battery for a power source through the use of an GaAs-based HBT power amplifier having a lowered turn-on voltage ($V_{BE}$). This is accomplished by the introduction of a base layer in an GaAs-based HBT with a lower energy gap, which, in turn, effectively reduces the turn-on voltage of the GaAs-based HBT. Moreover, this configuration effectively improves the power added efficiency ($\eta_{PA}$), which is defined below, of the electronic device.

The heterojunction bipolar transistor of the present invention includes a collector region having at least one layer disposed on a substrate to form a first stack, a base region having at least one layer disposed on a portion of the collector region to form a second stack. The HBT further includes emitter region having at least one layer disposed over a portion of a base region to form a third stack and a contact region having at least one layer disposed over a portion of the emitter region to form a fourth stack. The lowering of the $V_{BE}$ of the HBT is realized by introducing a base spacer layer having a lowered energy gap in the base region or alternatively by introducing an emitter spacer layer having a lowered energy gap in the emitter region, or alternatively by both. The lowered energy gap of the base spacer layer or the emitter spacer layer allow the HBT to realize a lower turn-on voltage $V_{BE}$ of less than or about 1.0 volts at a collector current density of about 2.0 amps/cm².

The present invention also provides a method for forming a compound semiconductor device that realizes a lower turn-on voltage. The method provides for forming on a substrate a collector region having at least one layer to form to a first stack and forming a base region having at least one layer on a portion of the collector region to form a second stack. The method further provides for forming an emitter region having at least one layer on a portion of the base region to form a third stack, and forming a contact region having at least one layer on a portion of the emitter region to form to fourth stack. The forming of the base region includes the forming of an optional base spacer layer. Optionally, the forming of the emitter region includes the forming of an emitter spacer layer. The forming of the base spacer layer or the emitter spacer layer, or both allows the fabricated compound semiconductor device to realize a $V_{BE}$ of less than about 1.0 volts at a collector current density of about 2.0 amps/cm².

BRIEF DESCRIPTION OF THE DRAWINGS

The foregoing and other objects, features and advantages of the invention will be apparent from the following description, and from the accompanying drawings, in which like reference characters refer to the same parts throughout the different views. The drawings illustrate principles of the invention and are not to scale.

DETAILED DESCRIPTION OF THE INVENTION

The compound semiconductor of the present invention advantageously employs either a base spacer layer or an emitter spacer layer, or optionally both, to allow the compound semiconductor device to realize a lower $V_{BE}$. The $V_{BE}$ realized by the compound semiconductor device of the present invention improves the power added efficiency and the reliability of the device. The improved power added efficiency ($\eta_{PA}$) resulting from the lowered $V_{BE}$ is particularly suitable for applications where the compound semiconductor device operates as a power amplifier and is fabricated from GaAs based material. Specifically, each of the illustrative embodiments described below are directed to a GaAs based HBT device for use in portable or mobile electronic devices, such as cellular telephones, laptop computers with wireless modem, and other like portable consumer devices, or other like or similar wireless communication applications, such as satellites or other wireless communications applications. The compound semiconductor device of the present invention is configurable to suit a selected application as illustrated in the exemplary embodiments described in more detail below.

The compound semiconductor device of the present invention provides a range of significant benefits to engineers that design electronic devices that are capable of communicating with a network in a wireless manner. The compound semiconductor device of the present invention increases the operating time of the electronic device capable of communicating with a network in a wireless manner if the electronic device uses a battery. The compound semiconductor device of the present invention also improves the power-added efficiency and reliability of power amplifier HBTs fabricated from GaAs by reducing the $V_{BE}$ of the HBT.

Figure 1:
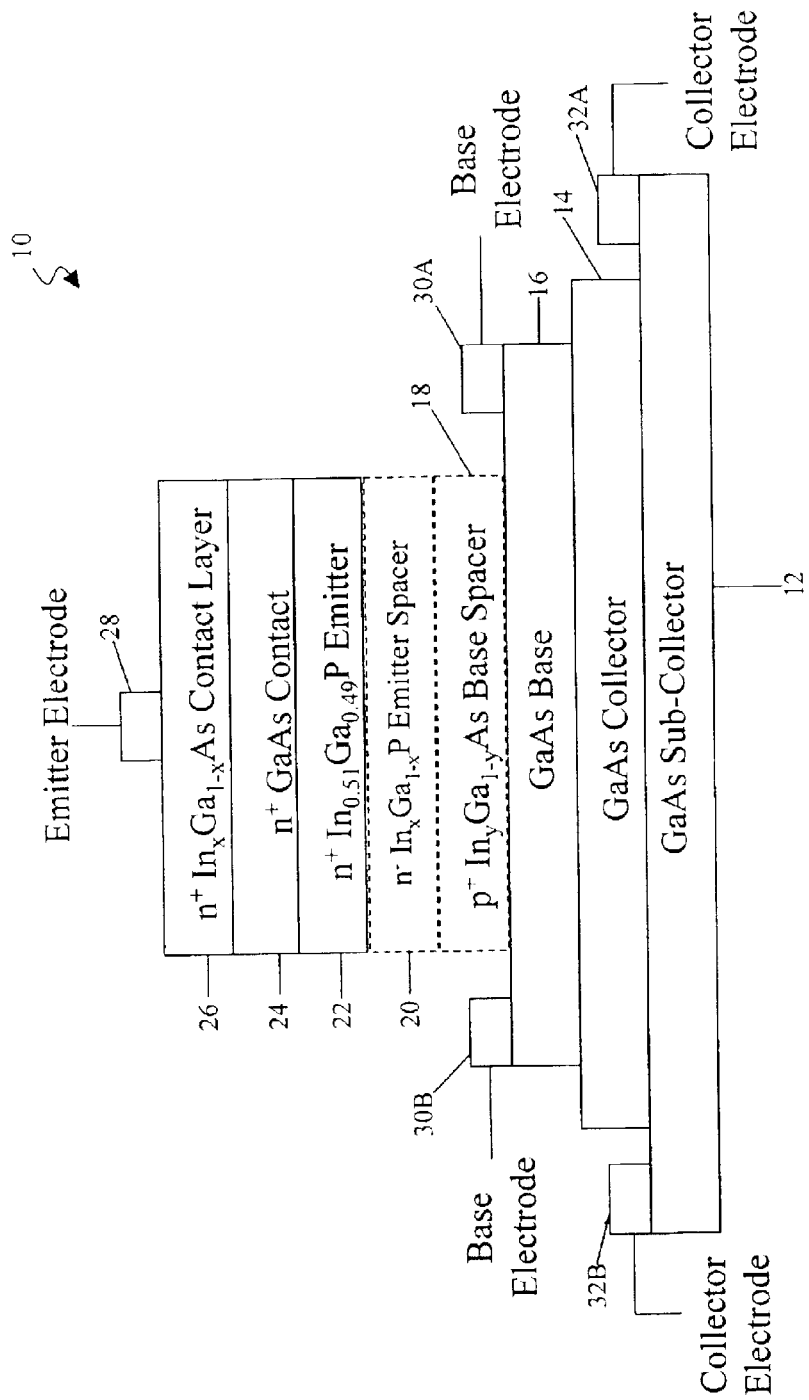
FIG. 1 is a cross-sectional view of a heterojunction bipolar transistor according to a first illustrative embodiment of the present invention.

FIG. 1 illustrates a cross-sectional view of an HBT according to a first illustrative embodiment of the present invention. The HBT 10 includes a collector region, a base region, an emitter region, and a contact region. The collector region of the HBT 10 includes a sub-collector layer 12 and a collector layer 14. The base region of the HBT 10 includes a base layer 16 and optionally a base spacer layer 18. In similar fashion, the emitter region of the HBT 10 includes an emitter layer 22 and optionally an emitter spacer layer 20. In like manner, the contact region of the HBT 10 includes a first contact layer 24, and a second contact layer 26. The HBT 10 further includes an emitter electrode 28 formed over a portion of a contact layer 26, base electrodes 30A and 30B formed over portions of the base layer 16, and collector electrodes 32A and 32B formed over portions of the subcollector layer 12.

In more detail, the sub-collector layer 12 is a GaAs material formed over a substrate and has a thickness of about 500 nm with a donor impurity concentration of about $4\times10^{18}$ $cm^{-3}$. The thickness of the sub-collector layer 12 can range from between about 500 nm to about 1,500 nm in 1 nm increments. In similar fashion, the doping concentration of the sub-collector layer 12 can range from between about $3\times10^{18}$ $cm^{-3}$ to about $5\times10^{18}$ $cm^{-3}$.

The collector layer 14 is formed of a GaAs material over a portion of the sub-collector layer 12 and has a thickness of about 500 nm and a donor impurity concentration of about $1\times10^{16}$ $cm^{-3}$. The thickness of the collector layer 14 can range from between about 100 nm to about 2,000 nm in 1 nm increments or decrements. The doping concentration of the collector layer 14 can range from between about $5\times10^{15}$ $cm^{-3}$ to about $1\times10^{17}$ $cm^{-3}$.

For the base layer 16, a GaAs material is formed over a portion of the collector layer 14 and is formed to have a thickness of about 70 nm and has an acceptor impurity concentration of about $4\times10^{19}$ $cm^{-3}$. The thickness of the base layer 16 can range from between about 20 nm and about 200 nm in increments or decrements of about 1 nm. The impurity concentration in the base layer can range between about $1\times10^{19}$ to about $1\times10^{20}$ $cm^{-3}$ The base spacer layer 18 is formed of a P+ type $In_xGa_{1-x}As$ material, where x can be up to about 0.3. The base spacer layer 18 is preferably formed of a P+ type $In_xGa_{1-x}As$ material. For example, the base spacer can be $In_{0.15}Ga_{0.85}As$ at a thickness of about 20 nm. Moreover, the base spacer layer 18 can have a thickness in the range between about 0 nm or some nominal thickness and about 40 nm with an acceptor impurity concentration range of about $1\times10^{19}$ to about $1\times10^{20}$ $cm^{-3}$.

For the emitter spacer layer 20, an N type $In_xGa_{1-x}P$ (0.5<x<0.7) material is formed to a thickness of between about 2 nm and about 40 nm with a donor impurity concentration between about $1\times10^{16}$ and about $1\times10^{18}$ $cm^{-3}$. The thickness of the emitter spacer layer 20 is kept to less than 40 nm to reduce a space charge recombination current between the emitter region and the base region. The emitter spacer layer 20 is preferably formed of an N type $In_xGa_{1-x}P$ material. An emitter spacer xcan be for example $In_{0.6}Ga_{0.4}P$ at a thickness of about 10 nm. The emitter spacer layer 20 is an optional layer in the HBT 10. The emitter spacer layer 20 can be introduced into the HBT 10 in place of the base spacer layer 18 or in conjunction with the base spacer layer 18 to realize a $V_{BE}$ for the HBT 10 of about 1.0 volts at a collector current density of about 2.0 amps/$cm^2$. Those skilled in the art will recognize that the $V_{BE}$ can range from between about 0.8 volts to about 1.0 volts at a collector current density from between about 1.0 amps/$cm^2$ to between about 2.0 amps/$cm^2$.

For the emitter layer 22, an $In_{0.51}Ga_{0.49}P$ material is N type with impurities in a concentration of about $3\times10^{17}$ $cm^{-3}$. The emitter layer 22 is formed to have a thickness of about 50 nm and is formed over a portion of the emitter spacer layer 20. The emitter layer 22 can be formed to have a thickness of between about 50 nm and about 300 nm in increments or decrements of about 1 nm. The donor impurity concentration in the emitter layer can range between about $1\times10^{16}$ and about $1\times10^{18}$ $cm^{-3}$.

The contact layer 24 is an GaAs material doped with N type impurities in a concentration of about $4\times10^{18}$ $cm^{-3}$. The contact layer 24 is formed to have a thickness of about 100 nm. The contact layer 26 is formed from an $In_xGa_{1-x}As$ material, where x=0.0 up to 0.6, doped with N type impurities in a high concentration in excess of about $1\times10^{19}$ $cm^{-3}$. It is desirable for the contact layer 26 to be formed from an $In_xGa_{1-x}As$ material doped with N type impurities at a high concentration in excess of $1\times10^{19}$ $cm^{-3}$. A contact layer could be $In_xGa_{1-x}As$ where the composition (x) varied linearly from 0 to 0.6 with a total thickness of 100 nm. The thickness of the contact layer 24 can range from between about 50 nm to about 300 nm in increments or decrements of about 1 nm.

The lowering of the turn-on voltage $V_{BE}$ in the above illustrative embodiment of the compound semiconductor device is accomplished by the introduction of the base spacer layer 18, or the emitter spacer layer 20, or both to lower an energy gap $\Delta E_g$ of the HBT 10 to values of 1.1–1.38 eV at 300° K. to bring about the turn-on voltage $V_{BE}$ of less than about 1.0 volts at a collector current density of about 2.0 amps/$cm^2$. It is known that the change in energy gap $\Delta E_g$ between the junction of the base region and the emitter region in the illustrative embodiment of the HBT 10 includes a conduction band energy step $\Delta E_c$ and a valence band energy step $\Delta E_v$. As a consequence of the $\Delta E_g$, an energy barrier appears in the conduction band at the junction of the emitter region and the base region, which tends to retard the flow of electrons from the emitter region to the base region in HBTs. Consequently, by lowering the $\Delta E_g$ of the base spacer layer 18 or alternatively the emitter spacer layer 20, or alternately both, a reduction in the energy barrier at the junction of the base region and the emitter region of the HBT 10 is realized. As such, the lowered $\Delta E_g$ provided by the base spacer layer 18 or alternatively the emitter spacer layer 20, or alternatively both improves the flow of electrons from the emitter region to the base region of the HBT 10 to realize a lower $V_{BE}$ in the HBT 10 of about 1.0 volts at a collector current density of about 2.0 amps/cm². As a result, the HBT 10 is able to realize an improvement in power added efficiency and an improvement in reliability. Power added efficiency is defined in equation (1) below.

$$\eta_{PA}=(\text{Power Out}-\text{Power In})/(V_{supply} \times I_{supply}) \times 100\% \quad (1)$$

Figure 2:
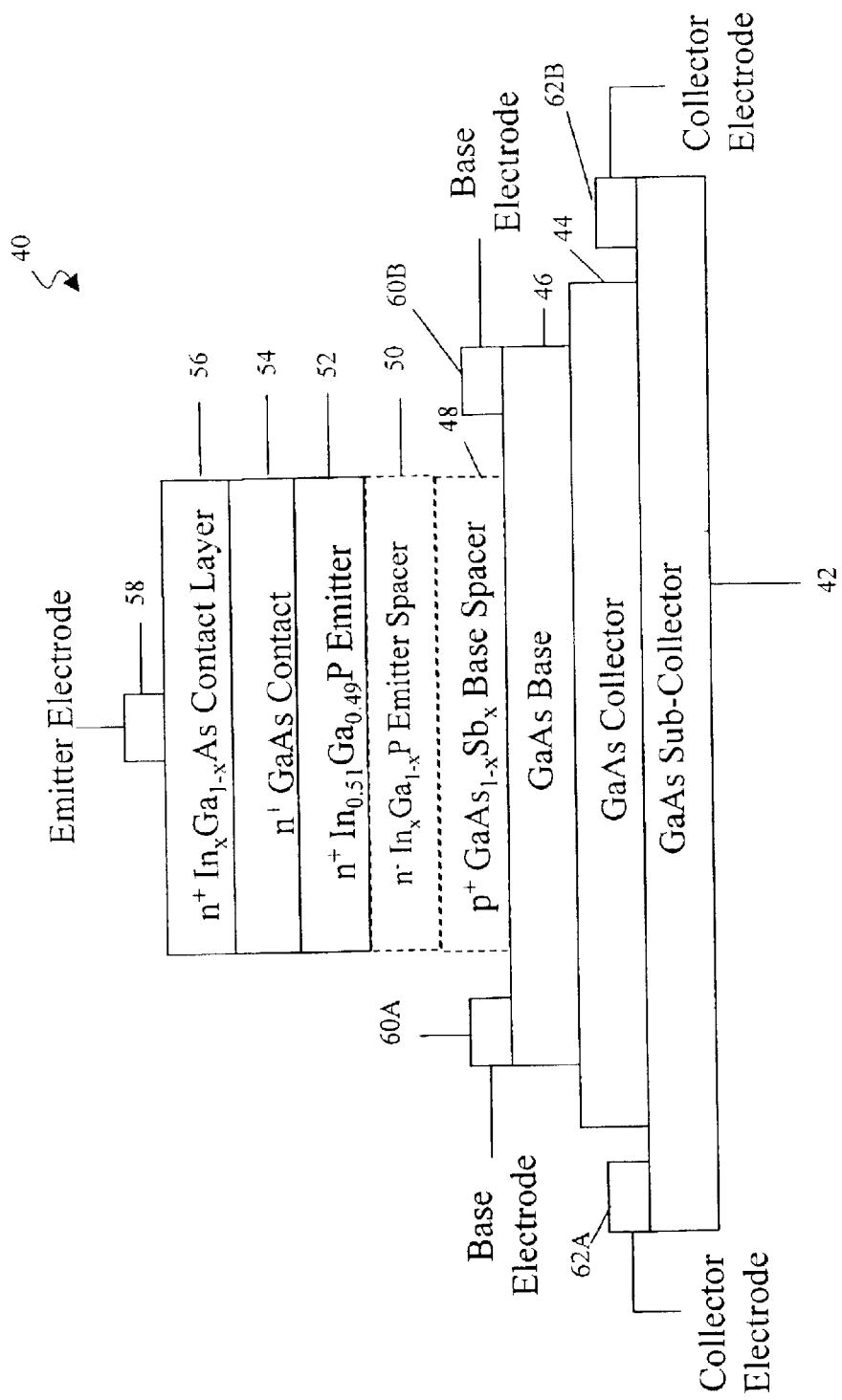
FIG. 2 is a cross-sectional view of a heterojunction bipolar transistor according to a second illustrative embodiment of the present invention.

FIG. 2 illustrates a cross-sectional view of an HBT according to a second illustrative embodiment of the present invention. The HBT 40 includes a collector region, a base region, an emitter region, and a contact region. The collector region of the HBT 40 includes a sub-collector layer 42 and a collector layer 44. The base region of the HBT 40 includes a base layer 46 and optionally a base spacer layer 48. In similar fashion, the emitter region of the HBT 40 includes an emitter layer 52 and optionally an emitter spacer layer 50. In like manner, the contact region of the HBT 40 includes a first contact layer 54, and a second contact layer 56. The HBT 40 further includes an emitter electrode 58 formed over a portion of the second contact layer 56, base electrodes 60A and 60B formed over portions of the base layer 46, and collector electrodes 62A and 62B formed over portions of the sub-collector layer 42.

In more detail, the sub-collector layer 42 is a GaAs material formed over a substrate and has a thickness of about 500 nm with a donor impurity concentration of about $4 \times 10^{18}$ cm⁻³. The thickness of the sub-collector layer 42 can range from between about 500 nm and about 1,500 nm in increments or decrements of about 1 nm. Further, the doping concentration of the sub-collector layer 42 can range from between about $3 \times 10^{18}$ cm⁻³ to about $5 \times 10^{18}$ cm⁻³.

The collector layer 44 is formed of a GaAs material having a thickness of about 500 nm and a low impurity concentration of about $1 \times 10^{16}$ cm⁻³. The collector layer 44 is formed over a portion of the sub-collector layer 42. The thickness of the collector layer 44 can range from between about 100 nm and about 2,000 nm in increments or decrements of about 1 nm. In similar fashion, the doping concentration of the collector layer 44 can range from between about $5 \times 10^{15}$ cm⁻³ to about $1 \times 10^{17}$ cm³¹ ³.

For the base layer 46, a GaAs material is formed over a portion of the collector layer 44 and is formed to have a thickness of about 70 nm with an acceptor impurity concentration of about $4 \times 10^{19}$ cm⁻³. The base layer 46 is formed to have a thickness of between about 20 nm and about 200 nm in increments or decrements of about 1 nm. The impurity concentration in the base layer can range between about $1 \times 10^{19}$ and about $1 \times 10^{20}$ cm⁻³ The base spacer layer 48 is formed of a P⁺ type GaAs$_{1-x}$Sb$_x$ (x up to 0.3) material. It is desirable to form the base spacer layer 48 of a P⁺ type GaAs$_{1-x}$Sb$_x$ material. A base spacer can be GaAs$_{0.85}$Sb$_{0.15}$ at a thickness of about 20 nm. The base spacer layer 48 has a thickness of between about 0 nm and about 40 nm and has an acceptor impurity concentration between about $1 \times 10^{19}$ and about $1 \times 10^{20}$ cm³¹ ³The base spacer layer 48 is an optional layer and can be introduced in conjunction with the emitter spacer layer 50 or in place of the emitter spacer layer 50.

For the emitter spacer layer 50, an N type In$_x$Ga$_{1-x}$P (0.5<x<0.7) material is formed to a thickness of between about 2 nm and about 40 nm with a donor impurity concentration between $1 \times 10^{16}$ to about $1 \times 10^{18}$ cm⁻³. The thickness of the emitter spacer layer 50 is kept to less than 40 nm to reduce a space charge recombination current between the emitter region and the base region. The emitter spacer layer 50 is preferably formed of an N type In$_x$Ga$_{1-x}$P material. An emitter spacer could be In$_{0.6}$Ga$_{0.4}$P at a thickness of about 10 nm. The emitter spacer layer 50 is an optional layer in the HBT 10. The emitter spacer layer 50 can be introduced into the HBT 40 in place of the base spacer layer 48 or in conjunction with the base spacer layer 48 to realize a $V_{BE}$ for the HBT 40 of about 1.0 volts at a collector current density of about 2.0 amps/cm². Those skilled in the art will recognize that the $V_{BE}$ can range from between about 0.8 volts to about 1.0 volts at a collector current density from between about 1.0 amps/cm² to between about 2.0 amps/cm².

For the emitter layer 52, an In$_{0.51}$Ga$_{0.49}$P material is doped with N type impurities in a concentration of about $3 \times 10^{17}$ cm⁻³. The emitter layer 52 is formed to have a thickness of about 50 nm. The thickness of the emitter layer 52 can range from between about 50 nm to about 300 nm in increments or decrements of about 1 nm. The donor impurity concentration in the emitter layer can range between about $1 \times 10^{16}$ and about $1 \times 10^{18}$ cm⁻³.

The contact 54 is a GaAs material doped with N type impurities in a high concentration of about $4 \times 10^{18}$ cm⁻³. The contact 54 is formed to have a thickness of about 100 nm. The contact 54 can have a thickness of between about 50 nm and about 300 nm in increments or decrements of about 1 nm. The contact layer 56, is formed from an In$_x$Ga$_{1-x}$As (x=0.0 up to 0.6) material doped with N type impurities in a high concentration in excess of $1 \times 10^{19}$ cm⁻³. The contact layer 56 can be In$_x$Ga$_{1-x}$As where the composition (x) varied linearly from 0 to 0.6 with a total thickness of 100 nm. The thickness of the contact layer 56 can range from between about 50 nm and about 200 nm in increments or decrements of about 1 nm.

The lowering of the turn-on voltage $V_{BE}$ in the above illustrative embodiment of the compound semiconductor device is accomplished by the introduction of either the base spacer layer 48 or the emitter spacer layer 50 or both to realize a lowered energy gap $\Delta E_g$ of about 1.10–1.38 eV at 300° K. in the HBT 40 to realize a turn-on voltage $V_{BE}$ of less than about 1.0 volts at a collector current density of about 2.0 amps/cm². It is known that the change in energy gap $\Delta E_g$ between the junction of the base region and the emitter region in the illustrative embodiment of the HBT 40 includes a conduction band energy step $\Delta E_c$ and a valence band energy step $\Delta E_v$. As a consequence of the $\Delta E_g$ an energy barrier appears in the conduction band at the junction of the emitter region and the base region, which tends to retard the flow of electrons from the emitter region to the base region in HBTs. Consequently, by lowering the $\Delta E_g$ of the base spacer layer 48 or alternatively the emitter spacer layer 50, a reduction in the energy barrier at the junction of the base region and the emitter region of the HBT 40 is realized. As such, the lowered $\Delta E_g$ provided by the base spacer layer 48 or alternatively the emitter spacer layer 50 or alternatively both, improves the flow of electrons from the emitter region to the base region of the HBT 40 to realize a $V_{BE}$ in the HBT 40 from between about 0.8 volts to about 1.0 volts at a collector current density from between about 1.0 amps/cm² to between about 2.0 amps/cm². Consequently, the HBT 40 is able to realize an improvement in power added efficiency as defined in equation (1) and an improvement in reliability.

Figure 3:
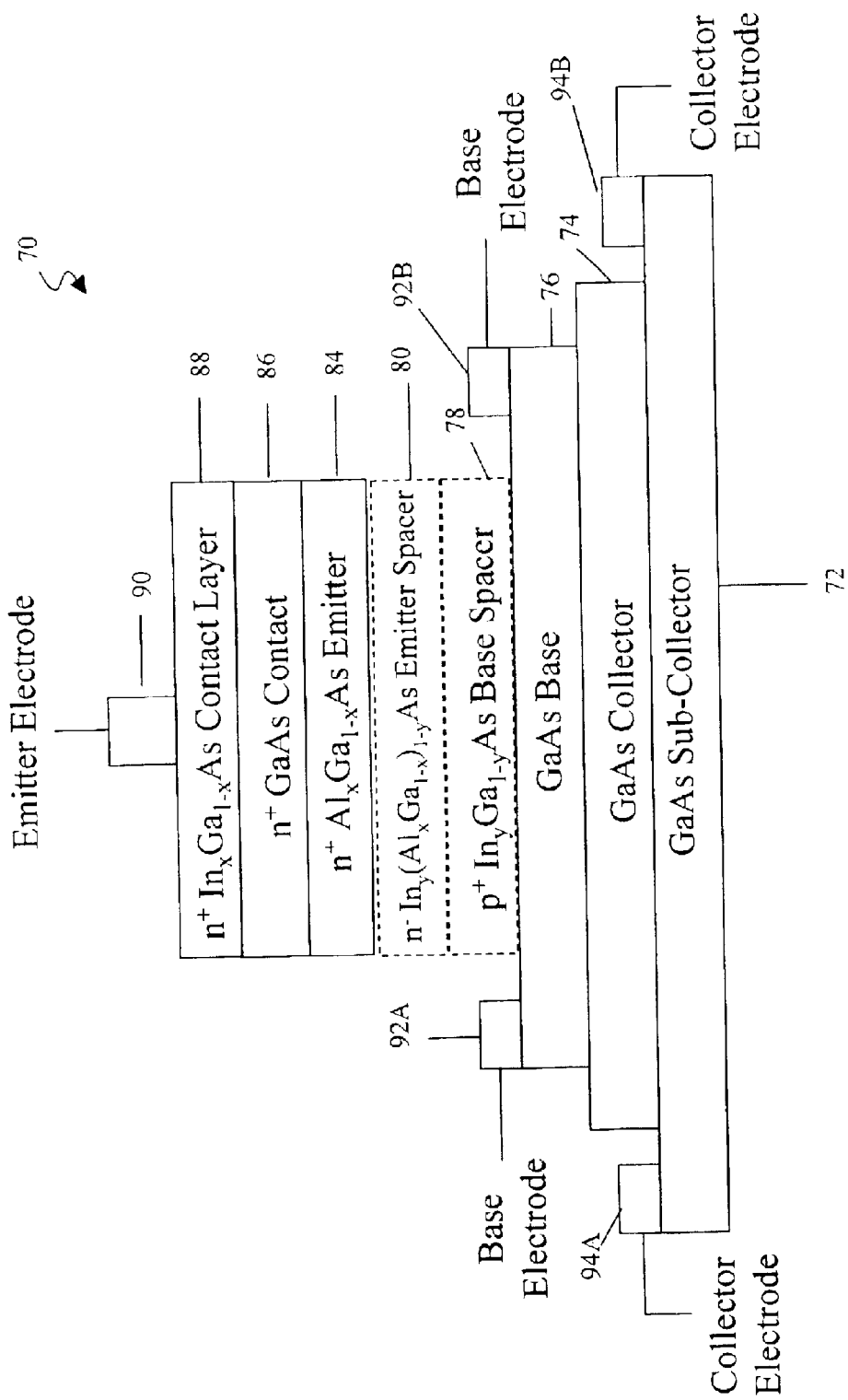
FIG. 3 is a cross-sectional view of a heterojunction bipolar transistor according to a third illustrative embodiment of the present invention.

FIG. 3 illustrates a cross-sectional view of an HBT according to a third illustrative embodiment of the present invention. The HBT 70 includes a collector region, a base region, an emitter region, and a contact region. The collector region of the HBT 70 includes a sub-collector layer 72 and a collector layer 74. The base region of the HBT 70 includes a base layer 76 and optionally a base spacer layer 78. In similar fashion, the emitter region of the HBT 70 includes an emitter layer 84, and optionally an emitter spacer layer 80. In like manner, the contact region of the HBT 70 includes a contact 86, and a contact layer 88. The HBT 70 further includes an emitter electrode 90 formed over a portion of the contact layer 88, base electrodes 92A and 92B formed over portions of the base layer 76, and collector electrodes 94A and 94B formed over portions of the sub-collector layer 72.

In more detail, the sub-collector layer 72 is a GaAs material formed over a substrate and has a thickness of about 500 nm with a donor impurity concentration of about $4 \times 10^{18}$ $cm^{-3}$. The thickness of the sub-collector layer 72 can range from between about 500 nm and about 1,500 nm in increments or decrements of about 1 nm. Moreover, the doping concentration of the sub-collector layer 72 can range from between about $3 \times 10^{18}$ $cm^{-3}$ to about $5 \times 10^{18}$ $cm^{-3}$.

The collector layer 74 is formed over a portion of the sub-collector layer 72. The formed GaAs material of the collector layer 74 has a thickness of about 500 nm and is doped to have a low donor impurity concentration of about $1 \times 10^{16}$ $cm^{-3}$. The thickness of the collector layer 74 can range from between about 100 nm and about 2,000 nm in increments or decrements of about 1 nm. Furthermore, the doping concentration of the collector layer 74 can range from between about $5 \times 10^{15}$ $cm^{-3}$ to about $1 \times 10^{17}$ $cm^{-3}$.

The base layer 76 is a GaAs material formed over a portion of the collector layer 74 and is formed to have a thickness of about 70 nm and doped to have an acceptor impurity concentration of about $4 \times 10^{19}$ $cm^{-3}$. The base layer 76 can have a range of thickness from between about 20 nm to about 200 nm in increments or decrements of about 1 nm. The impurity concentration in the base layer can range between about $1 \times 10^{19}$ and about $1 \times 10^{20}$ $cm^{-3}$.

For the base spacer layer 78, a P$^+$ type $In_yGa_{1-y}As$ (y up to 0.3) material is formed over a portion of the base layer 76. It is desirable to form the base spacer layer 78 of a P$^+$ type $In_yGa_{1-y}As$ material. A base spacer can be $In_{0.15}Ga_{0.85}As$ at a thickness of about 20 nm. The base spacer layer 78 has a thickness of between about 2 nm and about 40 nm in increments or decrements of about 1 nm and is doped with an impurity concentration between $1 \times 10^{19}$ $cm^{-3}$ to $1 \times 10^{20}$ $cm^{-3}$. The base spacer layer is an optional layer 78 in the HBT 70.

For the emitter spacer layer 80, an N type $In_y(Al_xGa_{1-x})_{1-y}As$ (0.0<y<0.15) (0.0<x<0.3) material. The emitter spacer layer 80 has a thickness of between about 2 nm and about 40 nm in increments or decrements of about 1 nm with an impurity concentration between $1 \times 10^{16}$ to $1 \times 10^{18}$ $cm^{-3}$. The emitter spacer layer 80 is preferably formed of an N type $In_y(Al_xGa_{1-x})_{1-y}As$ material. An emitter spacer could be $In_{0.15}(Al_{0.2}Ga_{0.8})_{0.85}As$ at a thickness of 10 nm. The emitter spacer layer 80 is an optional layer in the HBT 70. The emitter spacer layer 80 can be introduced into the HBT 70 in place of the base spacer layer 78 or in conjunction with the base spacer layer 78 to realize a $V_{BE}$ for the HBT 70 from between about 0.8 volts to about 1.0 volts at a collector current density from between about 1.0 amps/$cm^2$ to between about 2.0 amps/$cm^2$.

The emitter layer 84 is formed of an $Al_{0.3}Ga_{0.7}As$ material over a portion of the emitter spacer layer 80. The emitter layer 84 is doped with N type impurities in a concentration of about $4 \times 10^{17}$ $cm^{-3}$. The emitter layer 84 is formed to have a thickness of about 50 nm. The thickness of the emitter layer 84 can range from between about 50 nm to about 300 nm in increments or decrements of about 1 nm. The impurity concentration in the emitter layer can range between $1 \times 10^{16}$ $cm^{-3}$ to about $1 \times 10^{18}$ $cm^{-3}$. The Al composition of the emitter can range from 0.1 to 0.5.

The contact 86 is a GaAs material doped with N type impurities in a high concentration of about $4 \times 10^{18}$ $cm^{-3}$. The contact 86 is formed to have a thickness of about 100 nm and is formed over a portion of the emitter layer 84. The thickness of the contact 86 can range from between about 50 nm to about 300 nm in increments or decrements of about 1 nm.

The contact layer 88, is formed from an $In_xGa_{1-x}As$ (x=0.0 up to 0.6) material doped with N type impurities in a high concentration in excess of $1 \times 10^{19}$ $cm^{-3}$. The contact layer 56 is formed to have a thickness of about 100 nm and is formed over a portion of the contact 86. The thickness of the contact layer 88 can range from between about 50 nm to about 300 nm in increments or decrements of about 1 nm.

The lowering of the turn-on voltage $V_{BE}$ in the above illustrative embodiment of the compound semiconductor device is accomplished by the introduction of the base spacer layer 78 having a lowered energy gap $\Delta E_g$ of about of about 1.1–1.38 eV at 300° K. to bring about the turn-on voltage $V_{BE}$ of less than about 1.0 volts at a collector current density of about 2.0 amps/$cm^2$. It is known that the change in energy gap $\Delta E_g$ between the junction of the base region and the emitter region in the illustrative embodiment of the HBT 70 includes a conduction band energy step $\Delta E_c$ and a valence band energy step $\Delta E_v$. As a consequence of the $\Delta E_g$, an energy barrier appears in the conduction band at the junction of the emitter region and the base region, which tends to retard the flow of electrons from the emitter region to the base region in HBTs. Consequently, by lowering the $\Delta E_g$ of the base spacer layer 78, a reduction in the energy barrier at the junction of the base region and the emitter region of the HBT 70 is realized. As such, the lowered $\Delta E_g$ provided by the base spacer layer 78 improves the flow of electrons from the emitter region to the base region of the HBT 70 to realize a $V_{BE}$ in the HBT 70 from between about 0.8 volts to about 1.0 volts at a collector current density from between about 1.0 amps/$cm^2$ to between about 2.0 amps/$cm^2$. Consequently, the HBT 70 is able to realize an improvement in power added efficiency as defined in equation (1) and an improvement in reliability.

The lowering of the turn-on voltage in the illustrative HBT 70 can be further accomplished by introducing the emitter spacer layer 80 instead of the base spacer layer 78 or in conjunction with the base spacer layer 78. The emitter spacer layer 80 having a lower energy gap $\Delta E_g$ of about 1.1–1.38 eV at 300° K. to realize the turn-on voltage $V_{BE}$ of less than about 1.0 volts at a collector current density of about 2.0 amps/$cm^2$. As discussed above, the emitter spacer layer 80 with the lowered energy gap $\Delta E_g$ allows the illustrative HBT 70 to increase the flow of electrons from the emitter region to the base region to lower the $V_{BE}$ of the HBT 70. In the illustrative HBT 70 the emitter spacer layer 80 is limited to a thickness of about 40 nm or less in order to reduce a space charge recombination current between the emitter region and the base region.

Figure 4:
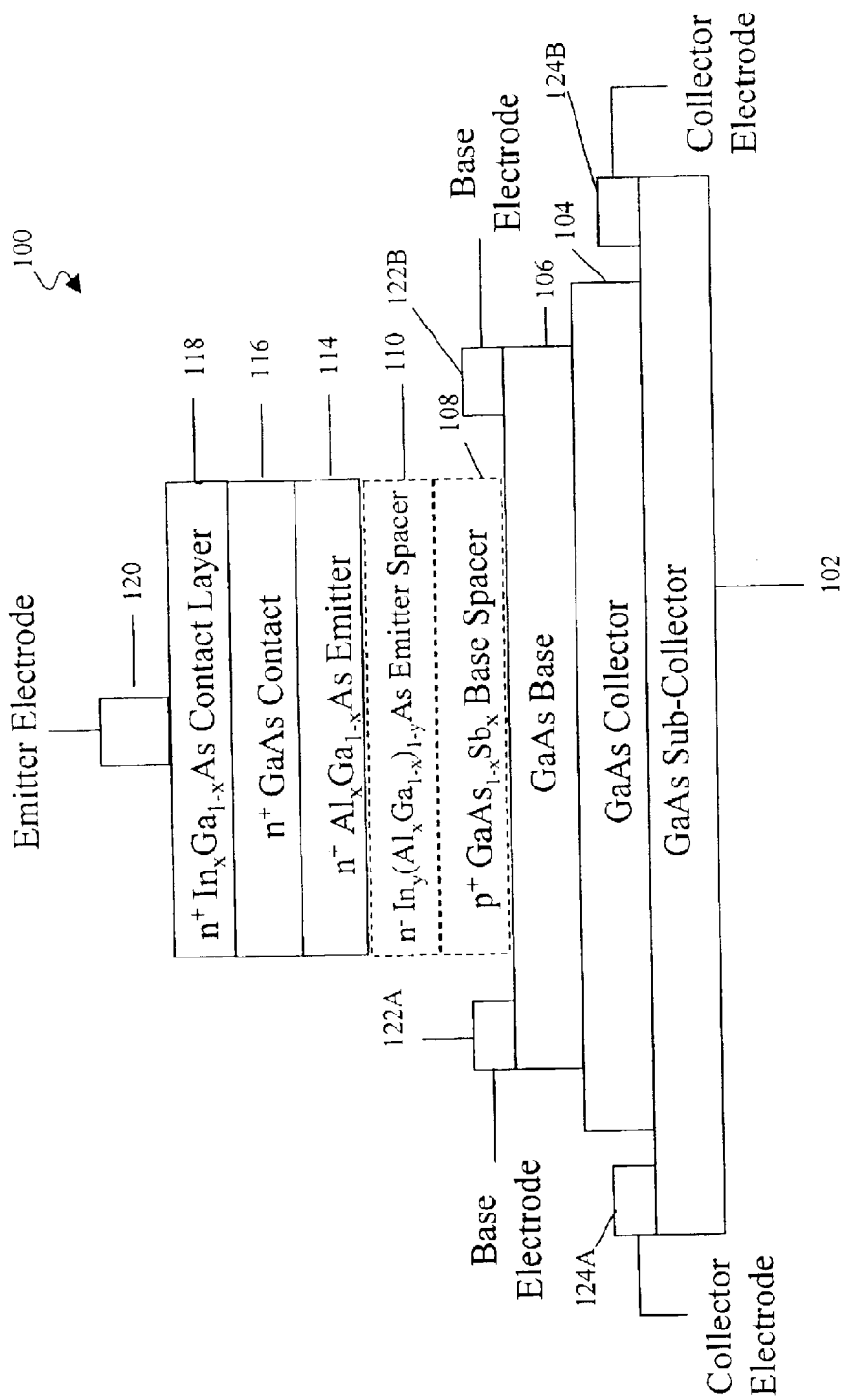
FIG. 4 is a cross-sectional view of a heterojunction bipolar transistor according to a fourth illustrative embodiment of the present invention.

FIG. 4 illustrates a cross-sectional view of an HBT according to a fourth illustrative embodiment of the present invention. The HBT 100 includes a collector region, a base region, an emitter region, and a contact region. The collector region of the HBT 100 includes a sub-collector layer 102 and a collector layer 104. The base region of the HBT 100 includes a base layer 106 and optionally a base spacer layer 108. In similar fashion, the emitter region of the HBT 100 includes an emitter layer 114, and optionally an emitter spacer layer 110. In like manner, the contact region of the HBT 100 includes a contact 116, and a contact layer 118. The HBT 100 further includes an emitter electrode 120 formed over a portion of the contact layer 118, base electrodes 122A and 122B formed over portions of the base layer 106, and collector electrodes 124A and 124B formed over portions of the sub-collector layer 102.

In more detail, the sub-collector layer 102 is a GaAs material formed over a substrate and has a thickness of about 500 nm with a donor impurity concentration of about $4 \times 10^{18}$ $cm^{-3}$. The thickness of the sub-collector layer 102 can range from between about 500 nm and about 1,500 nm in increments or decrements of about 1 nm. Further, the doping concentration of the sub-collector layer 102 can range from between about $3 \times 10^{18}$ $cm^{-3}$ to about $5 \times 10^{18}$ $cm^{-3}$.

The collector layer 104 is formed over a portion of the sub-collector layer 102. The formed GaAs material of the collector layer 104 has a thickness of about 500 nm and is doped to have a donor impurity concentration of about $1 \times 10^{16}$ $cm^{-3}$. The thickness of the collector layer 74 can range from between about 100 nm and about 2,000 nm in increments or decrements of about 1 nm. Furthermore, the doping concentration of the collector layer 74 can range from between about $5 \times 10^{15}$ $cm^{-3}$ to about $1 \times 10^{17}$ $cm^{-3}$.

The base layer 106 is a GaAs material formed over a portion of the collector layer 104 and is formed to have a thickness of about 70 nm and doped to have an acceptor impurity concentration of about $4 \times 10^{19}$ $cm^{-3}$. The base layer 106 can have a range of thickness from between about 20 nm to about 200 nm in increments or decrements of about 1 nm. The impurity concentration in the base layer can range between $1 \times 10^{19}$ $cm^{-3}$ to about $1 \times 10^{20}$ $cm^{-3}$.

For the base spacer layer 108, a $P^+$ type $GaAs_{1-x}Sb_x$ (x up to 0.3) material is optionally formed over a portion of the base layer 106. It is desirable to form the base spacer layer 108 of a $P^+$ type $GaAs_{1-x}Sb_x$ material. A base spacer could be $GaAs_{0.8}Sb_{0.2}$ at a thickness of 100 Å. The base spacer layer 108 has a thickness of between about 0 nm and about 40 nm with an impurity concentration range of $1 \times 10^{19}$ $cm^{-3}$ to about $1 \times 10^{20}$ $cm^{-3}$.

For the emitter spacer layer 110, an N type $In_y(Al_xGa_{1-x})_{1-y}As$ (0.0<y<0.15) (0.0<x<0.3) material. The emitter spacer layer 110 has a thickness of between about 2 nm and about 40 nm and is doped with an impurity concentration between $1 \times 10^{16}$ to $1 \times 10^{18}$ $cm^{-3}$. An emitter spacer could be $In_{0.15}(Al_{0.2}Ga_{0.8})_{0.85}As$ at a thickness of 10 nm. The emitter spacer layer 110 is preferably formed of an N type $In_y(Al_xGa_{1-x})_{1-y}As$ material. The emitter spacer layer 110 is an optional layer in the HBT 100. The emitter spacer layer 110 can be introduced into the HBT 100 in place of the base spacer layer 108 or in conjunction with the base spacer layer 108 to realize a $V_{BE}$ for the HBT 100 of about 1.0 volts at a collector current density of about 2.0 amps/cm².

The emitter layer 114 is formed of an $Al_xGa_{1-x}As$ (0.0<x<0.3) material over a portion of the emitter buffer layer 112. The emitter layer 114 is doped with N impurities in a concentration of about $4 \times 10^{17}$ $cm^{-3}$. The emitter layer 114 is formed to have a thickness of about 20 nm. The thickness of the emitter layer 114 can range from between about 50 nm to about 300 nm in increments or decrements of about 1 nm. The impurity concentration of the emitter can range from $1 \times 10^{16}$ to $1 \times 10^{18}$ $cm^{-3}$ The contact 116 is a GaAs material doped with N type impurities in a high concentration of about $4 \times 10^{18}$ $cm^{-3}$. The contact 116 is formed to have a thickness of about 100 nm and is formed over a portion of the emitter 114. The thickness of the contact 116 can range from between about 50 nm to about 300 nm in increments or decrements of about 1 nm.

The contact layer 118, is formed from an $In_xGa_{1-x}As$ (x=0.0 up to 0.6) material doped with $N^+$ type impurities in a donor concentration in excess of $1 \times 10^{19}$ $cm^{-3}$. The contact layer 118 is formed to have a thickness of about 100 nm and is formed over a portion of the contact 116. The thickness of the contact layer 118 can range from between about 50 nm to about 200 nm in increments or decrements of about 1 nm.

The lowering of the turn-on voltage $V_{BE}$ in the above illustrative embodiment of the compound semiconductor device to between about 0.8 volts to about 1.0 volts at a collector current density from between about 1.0 amps/cm² to between about 2.0 amps/cm² is accomplished by the introduction of the base spacer layer 108 having a lowered energy gap $\Delta E_g$ of 1.1–1.38 eV at 300° K. It is known that the change in energy gap $\Delta E_g$ between the junction of the base region and the emitter region in the illustrative embodiment of the HBT 100 includes a conduction band energy step $\Delta E_c$ and a valence band energy step $\Delta E_v$. As a consequence of the $\Delta E_g$, an energy barrier appears in the conduction band at the junction of the emitter region and the base region, which tends to retard the flow of electrons from the emitter region to the base region in HBTs. Consequently, by lowering the $\Delta E_g$ of the base spacer layer 108, a reduction in the energy barrier at the junction of the base region and the emitter region of the HBT 100 is realized. As such, the lowered $\Delta E_g$ provided by the base spacer layer 108 improves the flow of electrons from the emitter region to the base region of the HBT 100 to realize a $V_{BE}$ in the HBT 100 of less than about 1.0 volts at a collector current density of about 2.0 amps/cm². Consequently, the HBT 100 is able to realize an improvement in power added efficiency as defined in equation (1) and an improvement in reliability.

The lowering of the turn-on voltage in the illustrative HBT 100 can be further accomplished by introducing the emitter spacer layer 110 in place of the base spacer layer 108, or in conjunction with the base spacer layer 108 to realize an HBT having a lower energy gap $\Delta E_g$ of 1.1–1.38 eV at about 300° K. between the junction of the base and the emitter. As discussed above, the emitter spacer layer 110 with the lowered energy gap $\Delta E_g$ allows the illustrative HBT 100 to increase the flow of electrons from the emitter region to the base region to lower the $V_{BE}$ of the HBT 100. In the illustrative HBT 100 the emitter spacer layer 110 is limited to a thickness of about 40 nm or less in order to reduce a space charge recombination current between the emitter region and the base region.

Figure 5:
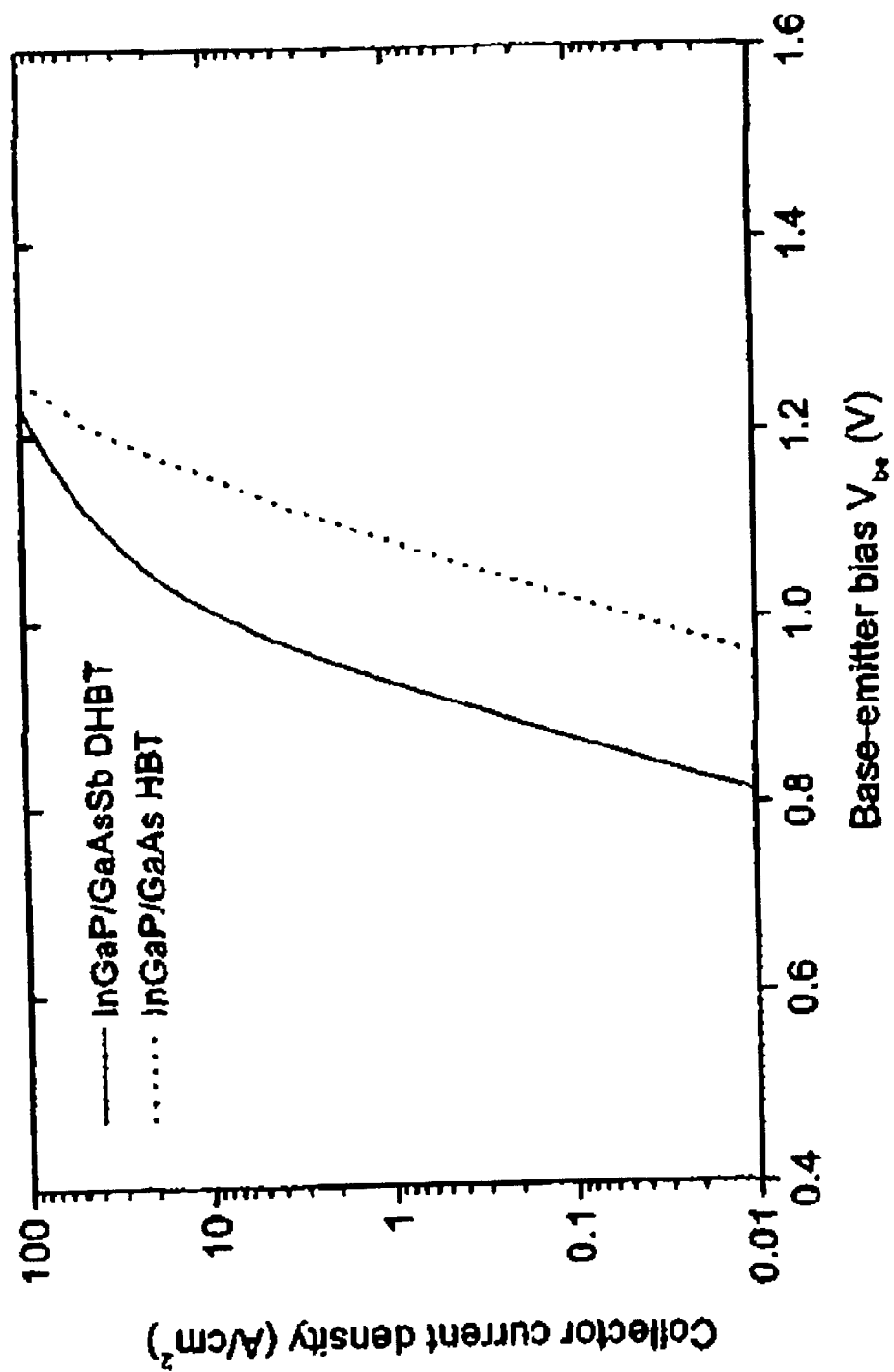
FIG. 5 is an exemplary graphical illustration of a heterojunction bipolar transistor turn-on voltage versus collector current density.

FIG. 5 is a graphical illustration of $V_{BE}$ versus collector current density for a selected HBT. The graphical illustration of FIG. 5 is merely exemplary and does not reflect either actual or theoretical values for any of the illustrative HBT's described herein. FIG. 5 is merely meant to facilitate understanding of the illustrative embodiments in the present invention.

FIG. 5 graphically illustrates the dependence of collector current density on $V_{BE}$ for a conventional InGaP/GaAs HBT and a conventional InGaP/GaAsSb double heterojunction bipolar transistor (DHBT). As graphically depicted in FIG. 5, the turn-on voltage or $V_{BE}$ of the conventional InGaP/GaAs HBT is about 1.09 volts at a collector current density of about 1 A/cm² and the conventional InGaP/GaAsSb DHBT is about 0.914 at a collector current density of about 1 A/cm². Moreover, as FIG. 5 graphically illustrates in most conventional HBT devices, the collector current density of the devices increases as $V_{BE}$ of the devices increases. In contrast, the illustrative HBT's of the present invention realize a VBE of less than about 1.0 volts at a collector current density of about 2 A/cm$^2$ or less.

Figure 6:
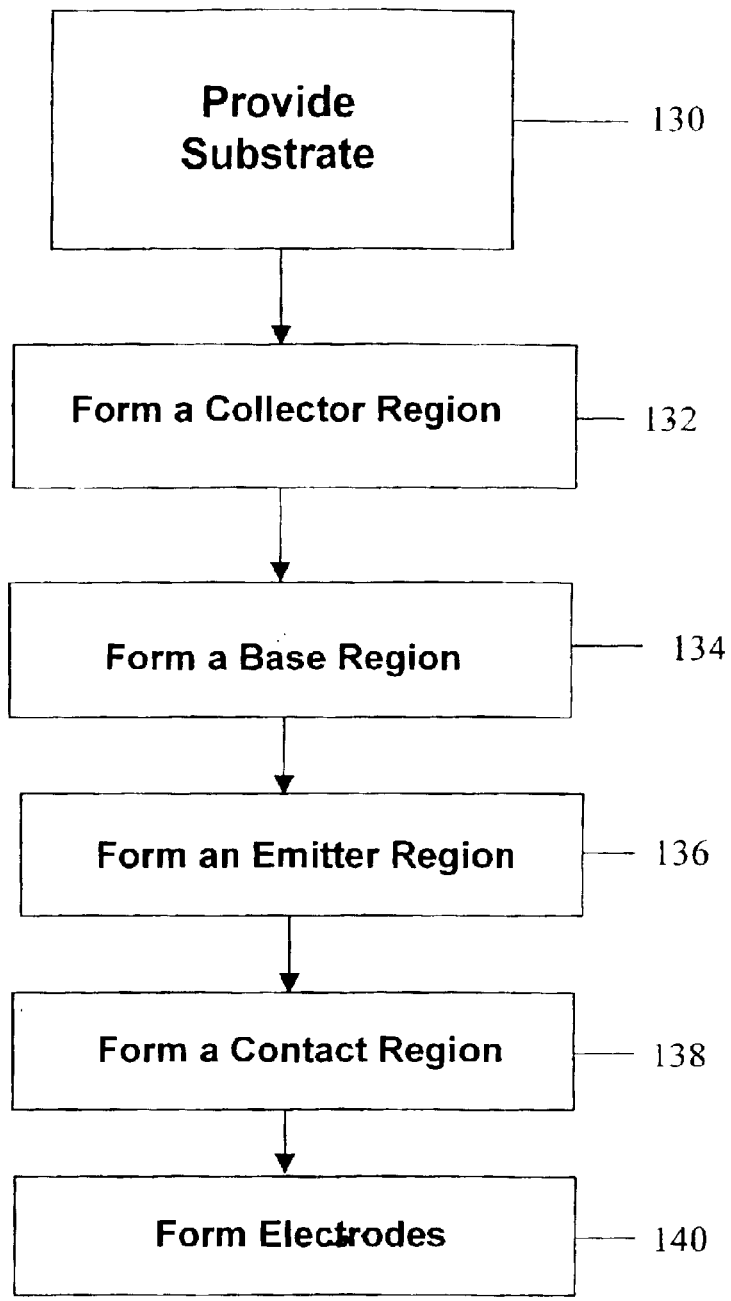
FIG. 6 is a schematic flow chart diagram illustrating a method for fabricating one or more of the heterojunction bipolar transistors illustrated in FIGS. 1–4.

FIG. 6 is a schematic flow chart diagram illustrating the method for forming one of the illustrative compound semiconductor devices of the present invention. On a provided substrate (step 130) a collector region is formed having at least one layer to form a first stack (step 132). Suitable techniques for forming the collector region include metal organic chemical vapor deposition (MOCVD) or molecular beam epitaxy (MBE). Upon formation of the collective region, a base region is formed or grown over a portion of the collector region (step 134). The base region is formed to include at least one layer and forms a second stack. An emitter region is grown or formed over a portion of the base region to form a third stack (step 136). The emitter region is formed to have at least one layer. In similar fashion, a contact region is grown or formed over a portion of the emitter region to form a fourth stack (step 138). The contact region is formed to have at least one layer. The emitter electrode, the base electrodes, and the collector electrodes are formed by metal deposition and liftoff, self-aligned or non-self-aligned, using a materials of Ti, Pt, Au, and Ge. (step 140). Those skilled in the art will recognize that each of the stacks discussed above are capable of being formed by MOCVD or by MBE. Nonetheless, those skilled in the art will recognize that other fabrication methods may be suitable depending on feature sizes or other constraints such as material type.

Those skilled in art will appreciate that the applications of the various compound semiconductor devices described herein are not limited solely to portable or mobile electronic devices capable of communicating with a network in a wireless manner. For example, the compound semiconductor devices of the present invention are configurable for use in a satellite or in any other electronic system or sub-system concerned with improving power added efficiency and reliability of the system.

While the present invention has been described with reference to illustrative embodiments thereof, those skilled in the art will appreciate that various changes in form in detail may be made without parting from the intended scope of the present invention as defined in the appended claims.

What is claimed is:

1. A compound semiconductor device, comprising:

a first GaAs layer:

a second GaAs layer formed on the first GaAs layer;

a third p-type GaAs layer formed on the second GaAs layer;

a p-type $In_yGa_{1-y}As$ layer ($0.0 \leq Y \leq 0.3$) formed on the third GaAs layer;

an n type $In_xGa_{1-x}P$ layer ($0.5 < x < 0.7$) formed on the $In_yGa_{1-y}As$ layer;

an n type $In_{0.51}Ga_{0.49}P$ layer formed on the n type $In_xGa_{1-x}P$ layer;

an n type GaAs layer formed on the n type $In_{0.51}Ga_{0.49}P$ layer; and an n type $In_xGa_{1-x}As$ layer ($0.0 < x < 0.6$) formed on the n type GaAs layer.

2. A compound semiconductor device, comprising:

a first GaAs layer:

a second GaAs layer formed on the first GaAs layer;

a third p-type GaAs layer formed on the second GaAs layer;

a p-type $In_yGa_{1-y}As$ layer ($0.0 \leq y \leq 0.3$) formed on the third GaAs layer;

an n type $In_y Al_x Ga_{1-x})_{1-y}As$ layer ($0.0 < y < 0.15$) ($0.0 < x < 0.3$) formed on the $In_yGa_{1-y}As$ layer;

an n type $Al_{0.3}Ga_{0.7}As$ layer formed on the n type $In_y(Al_xGa_{1-x})_{1-y}As$ layer;

an n type $Al_xGa_{1-x}As$ ($0.0 < x < 0.3$) layer formed on the n type $Al_{0.3}Ga_{0.7}As$ layer;

an n type GaAs layer formed on the n type $Al_xGa_{1-x}As$ layer; and an n type $In_xGa_{1-x}As$ layer ($0.0 < x < 0.6$) formed on the n type GaAs layer.

3. A compound semiconductor device, comprising:

a first GaAs layer:

a second GaAs layer formed on the first GaAs layer;

a p-type GaAs layer formed on the second GaAs layer;

an p-type $GaAs_{1-x}Sb_x$ layer ($0.0 \leq x \leq 0.3$) formed on the third GaAs layer;

an n type $In_y(Al_xGa_{1-x})_{1-y}As$ layer ($0.0 < y < 0.3$) ($0.0 < x < 0.3$) formed on the $GaAs_{1-x}Sb_x$ layer;

an n type $Al_{0.3}Ga_{0.7}As$ layer formed on the n type $In_y(Al_xGa_{1-x})_{1-y}As$ layer;

an n type $Al_xGa_{1-x}As$ ($0.0 < x < 0.5$) layer formed on the n type $Al_{0.3}Ga_{0.7}As$ layer;

an n type GaAs layer formed on the n type $Al_xGa_{1-x}As$ layer; and an n type $In_xGa_{1-x}As$ layer ($0.0 < x < 0.6$) formed on the n type GaAs layer.

4. A heterojunction bipolar transistor, comprising, a contact having at least one layer of a first material;

an emitter having an emitter spacer of an n type $In_xGa_{1-x}P$ ($0.5 < x < 0.7$) material;

a base having a base spacer of an $GaAs_{1-x}Sb_x$ ($0.0 \leq x \leq 0.3$) material; and a collector having at least one layer of said first material.

* * * * *